(12) United States Patent
Basceri et al.

(10) Patent No.: US 6,908,639 B2
(45) Date of Patent: Jun. 21, 2005

(54) MIXED COMPOSITION INTERFACE LAYER AND METHOD OF FORMING

(75) Inventors: Cem Basceri, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/825,087

(22) Filed: Apr. 2, 2001

(65) Prior Publication Data

US 2002/0142588 A1 Oct. 3, 2002

(51) Int. Cl.[7] .......................... B05D 5/12; C23C 14/00; C23C 16/00; H01L 21/20; H01G 7/00
(52) U.S. Cl. ................ 427/79; 427/255.26; 427/255.28; 427/255.7; 427/255.19; 438/386; 438/393; 438/396; 438/399; 117/89; 29/25.03; 29/29.41
(58) Field of Search ................................. 438/386, 393, 438/396, 399; 29/25.03, 25.41; 117/89; 427/79, 255.19, 255, 0.6, 255.28, 255.7, 58, 255.26

(56) References Cited

U.S. PATENT DOCUMENTS

| | | | | |
|---|---|---|---|---|
| 4,058,430 A | * | 11/1977 | Suntola et al. ............... | 156/611 |
| 4,109,031 A | * | 8/1978 | Marscher ..................... | 427/191 |
| 4,228,212 A | | 10/1980 | Brown et al. | |
| 5,879,459 A | * | 3/1999 | Gadgil et al. ................ | 118/715 |
| 6,015,989 A | * | 1/2000 | Horikawa et al. ........... | 257/309 |
| 6,111,321 A | | 8/2000 | Agarwala | |
| 6,241,821 B1 | * | 6/2001 | Yu et al. ..................... | 117/108 |
| 6,407,435 B1 | | 6/2002 | Ma et al. | |
| 6,428,859 B1 | | 8/2002 | Chiang et al. | |
| 6,458,416 B1 | | 10/2002 | Derderian et al. | |
| 6,465,828 B2 | | 10/2002 | Agarwal | |
| 6,524,868 B2 | * | 2/2003 | Choi et al. ..................... | 438/3 |
| 6,534,395 B2 | | 3/2003 | Werkhoven et al. | |
| 6,570,253 B1 | * | 5/2003 | Lim et al. .................... | 257/758 |
| 6,576,053 B1 | | 6/2003 | Kim et al. | |
| 6,597,029 B2 | * | 7/2003 | Kim et al. .................... | 257/295 |
| 6,818,935 B2 | * | 11/2004 | Kweon et al. ............... | 257/295 |
| 2001/0041250 A1 | | 11/2001 | Werkhoven et al. | |
| 2002/0106536 A1 | | 8/2002 | Lee et al. | |
| 2002/0110991 A1 | * | 8/2002 | Li .............................. | 438/347 |
| 2003/0032281 A1 | | 2/2003 | Werkhoven et al. | |

OTHER PUBLICATIONS

Suatola, "Atomic Layer Epitaxy", Handbook of Crystal Growth, vol. 3, Chapter 14, pps. 602–663.
Suntola. "Surface Chemistry of Materials Deposition at Atomic Layer Level". Applied Surface Science. vol. 100/101. Mar. 1996. pp. 391–398.
Websters II New Riverside University Dictionary, 1994, Riverside Publishing Company, p. 118.

* cited by examiner

*Primary Examiner*—Brian K. Talbot
(74) *Attorney, Agent, or Firm*—Wells St. John P.S.

(57) ABSTRACT

An interface forming method includes forming a first layer containing a first chemical element and chemisorbing on the first layer an interface layer containing at least one monolayer of the first chemical element intermixed with a second chemical element different from the first chemical element. A second layer comprising the second chemical element can be formed on the interface layer. The first layer might not substantially contain the second chemical element, the second layer might not substantially contain the first chemical element, or both. An apparatus can include a first layer containing a first chemical element, an interface layer chemisorbed on the first layer, and a second layer containing a second element on the interface layer. The interface layer can contain at least one monolayer of the first chemical element intermixed with a second chemical element different from the first chemical element.

40 Claims, 2 Drawing Sheets

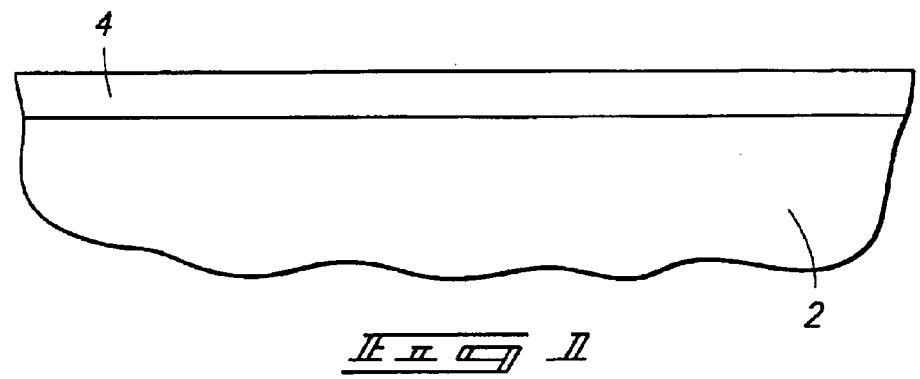
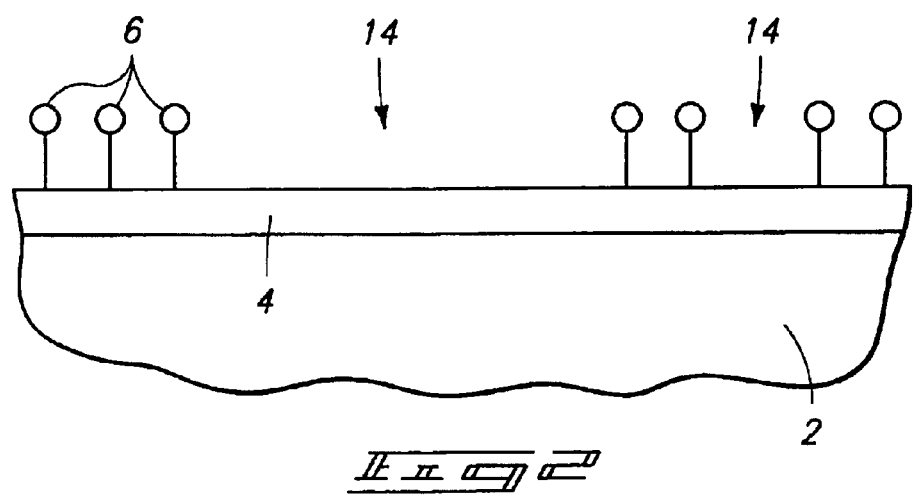

MIXED COMPOSITION INTERFACE LAYER AND METHOD OF FORMING

TECHNICAL FIELD

The present invention relates to chemisorbed interface layers of mixed composition and methods of forming interfaces, including interface layers in electronic devices and methods of formation.

BACKGROUND OF THE INVENTION

The need for better performing electronic devices, such as semiconductor devices, is increasing and a wider variety of materials are becoming candidates for incorporation into such devices. Although such materials may provide the necessary physical characteristics desired of a semiconductor, conductor, insulator, etc., incompatibilities can arise wherein materials do not adhere well together, creating defects in finished products. Surface defects, vacancies, misalignments, etc. can adversely impact adherence of one layer to another and can impact the interface there between. Accordingly, improvements in adherence of layers and interfaces would provide significant advantages in reducing product defects.

SUMMARY OF THE INVENTION

According to one aspect of the invention, an interface forming method can include forming a first layer comprising a first chemical element and chemisorbing on the first layer an interface layer including the first chemical element intermixed with a second chemical element different from the first chemical element. The interface layer can include at least one monolayer. A second layer is formed on the interface layer and can contain the second chemical element. As an example, the first layer might not contain the second chemical element. Similarly, the second layer might not contain the first chemical element. The first layer can be conductive and the second layer can be insulative. As a further example, the first layer can include a metal other than Ta, such as Pt, and the second layer can include $Ta_2O_5$.

In another aspect of the invention an electronic device interface forming method includes forming a first layer containing a first chemical element and chemisorbing a first portion of at least one monolayer over the first layer, the first portion including the first chemical element. A second portion of the at least one monolayer can be chemisorbed over the first layer and include a second chemical element different from the first chemical element. The first and second portions of the at least one monolayer can be contained in an interface layer. A second layer can be formed on the interface layer and contain the second chemical element. As an example, the first portion of the at least one monolayer can be chemisorbed on first parts of the first layer and the second portion of the at least one monolayer can be chemisorbed on second parts of the first layer.

As yet another aspect of the invention, an electronic device interface forming method can include forming a first device layer containing a first chemical element and chemisorbing a first unsaturated interface layer including the first chemical element on the first device layer. The first interface layer can have a thickness of about 1 to about 10 monolayers. A second unsaturated interface layer may be chemisorbed at least on the first device layer in areas not saturated by the first interface layer. The second interface layer can contain a second chemical element. A second device layer containing a second chemical element can be formed on the first and second interface layers.

An apparatus according to one aspect of the invention can include a first layer containing a first chemical element and an interface layer chemisorbed on the first layer. The interface layer can contain a first chemical element intermixed with a second chemical element different from the first chemical element. The apparatus can further include a second layer on the interface layer containing a second chemical element.

In another aspect of the invention an electronic device includes a first layer containing a first chemical element, a first portion of at least one monolayer chemisorbed on the first layer, a second portion of the at least one monolayer chemisorbed on the first layer, an interface layer comprising the first and second portions of the at least one monolayer, and a second layer on the interface layer. The first portion can contain the first chemical element and the second portion can contain a second chemical element different from the first chemical element. The second layer can contain the second chemical element.

BRIEF DESCRIPTION OF THE DRAWINGS

Preferred embodiments of the invention are described below with reference to the following accompanying drawings.

FIG. 1 shows a sectional view of a substrate portion at a processing step according to an aspect of the invention.

FIG. 2 shows a sectional view of a substrate portion at a processing step subsequent to that shown in FIG. 1.

DETAILED DESCRIPTION OF THE PREFERRED EMBODIMENTS

Figure 3:
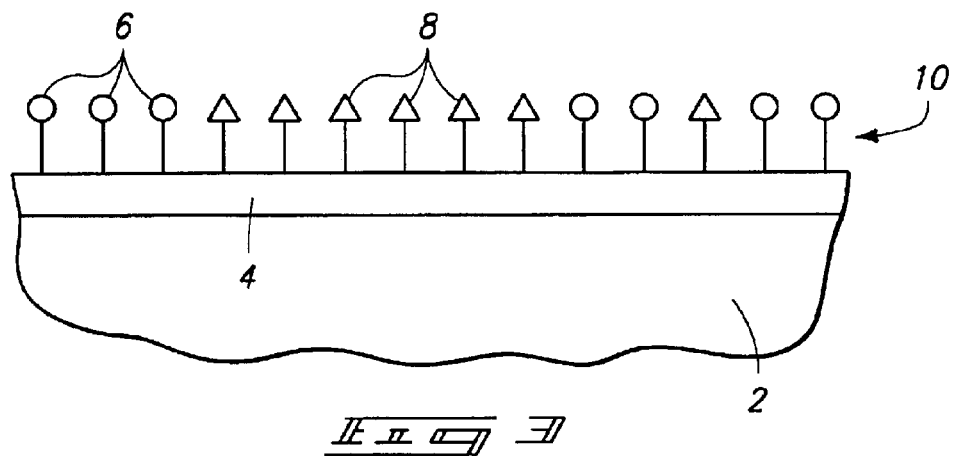
FIG. 3 shows a sectional view of a substrate portion at a processing step subsequent to that shown in FIG. 2.

This disclosure of the invention is submitted in furtherance of the constitutional purposes of the U.S. Patent Laws "to promote the progress of science and useful arts" (Article 1, Section 8).

The methods and apparatuses of the aspects of the invention described herein are applicable to a variety of technologies. One example of an apparatus is an electronic device. Similarly, one example of an interface forming method is an electronic device interface forming method. However, the aspects of the invention are not limited to such devices or interface forming methods. The steps of the methods described herein may be accomplished by a variety of methods as well. For example, atomic layer deposition (ALD) can be a suitable technique for accomplishing the steps of the methods described herein.

ALD involves formation of successive atomic layers on a substrate. Such layers may comprise an epitaxial, polycrystalline, amorphous, etc. material. ALD may also be referred to as atomic layer epitaxy, atomic layer processing, etc. Further, the invention may encompass other deposition methods not traditionally referred to as ALD, for example, chemical vapor deposition (CVD), but nevertheless including the method steps described herein. The deposition methods herein may be described in the context of formation on a semiconductor wafer. However, the invention encompasses deposition on a variety of substrates besides semiconductor substrates.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Described in summary, ALD includes exposing an initial substrate to a first chemical species to accomplish chemisorption of the species onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Ne, Kr, Xe, etc. Purging may instead include contacting the substrate and/or monolayer with any substance that allows chemisorption byproducts to desorb and reduces the concentration of a contacting species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. The various aspects of the present invention described herein are applicable to any circumstance where ALD may be desired.

Often, traditional ALD occurs within an often-used range of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition species that chemisorbs to a substrate or previously deposited species. An ALD process regime may provide a simultaneously contacted plurality of species of a type or under conditions such that ALD chemisorption, rather than CVD reaction occurs. Instead of reacting together, the species may chemisorb to a substrate or previously deposited species, providing a surface onto which subsequent species may next chemisorb to form a complete layer of desired material.

Under most CVD conditions, deposition occurs largely independent of the composition or surface properties of an underlying substrate. By contrast, chemisorption rate in ALD might be influenced by the composition, crystalline structure, and other properties of a substrate or chemisorbed species. Other process conditions, for example, pressure and temperature, may also influence chemisorption rate. Accordingly, observation indicates that chemisorption might not occur appreciably on portions of a substrate though it occurs at a suitable rate on other portions of the same substrate.

According to one aspect of the invention, an interface forming method may include forming a first layer containing a first chemical element and chemisorbing on the first layer an interface layer containing at least one monolayer of the first chemical element intermixed with a second chemical element different from the first chemical element. The method can further include forming a second layer containing the second chemical element on the interface layer. The first and second layers can be formed by any method. Since the interface layer contains the first chemical element, the interface layer can adhere well to the first layer. Also, since the interface layer contains the second chemical element, the interface layer also can adhere well to the second layer. Accordingly, the interface layer potentially can improve adherence of the second layer over the first layer.

The above described method can be particularly advantageous when the second layer might not adhere well to the first layer. For example, the first and second layer might not adhere well when the first layer does not substantially contain the second chemical element, the second layer does not substantially contain the first chemical element, or both. Observation indicates that such circumstance can arise, for example, when the first layer is conductive and the second layer is insulative, or vice versa. The method may be particularly useful when the first layer contains a metal other than Ta and the second layer contains $Ta_2O_5$. By way of example, the metal other than Ta can be Pt.

An exemplary metal-insulator-metal capacitor stack can include, respectively, Pt, $Ta_2O_5$, and Pt. The interfacial properties in the stack can influence current leakage and other performance characteristics of the capacitor. Also, suitable adhesion of the stack layers maintains integrity of the device. In keeping with the various aspects of the invention described herein, an interface layer can be formed between the Pt and $Ta_2O_5$ that includes intermixed Pt and $Ta_2O_5$ formed by ALD. Such a concept can also be used to enhance adhesion of other materials, for example, adhesion of Pt and Ru to oxide containing surfaces, such as barium strontium titanate, lead zirconate titanate, $Ta_2O_5$, etc.

In another aspect of the invention, an electronic device interface forming method includes forming an interface layer between and in contact with a first layer containing a first chemical element and a second layer containing a second chemical element different from the first chemical element. The interface layer can be formed separately from forming the first and second layers and contain the first and second chemical elements. The interface layer can also be formed such that it does not substantially contain material from the first or second layers as separately formed. Preferably, the interface layer contains at least one monolayer of intermixed first and second chemical elements chemisorbed on the first layer.

The interface layer is described as not substantially containing material from the first or second layers to indicate that the method used to form the interface layer adds material to a surface of the preexisting first or second layer without reliance on material therein to form part of the composition of the interface layer. It is recognized that after formation of the interface layer, insignificant amounts of material from the first or second layers can potentially diffuse into the interface layer. However, such diffusion still allows formation of an interface layer not substantially containing material from the first or second layers. Surface nitridation or surface oxidation as known to those skilled in the art are examples of methods that rely on existing materials to form part of a composition in a subsequently formed layer.

Similarly, when the first layer does not substantially contain the second chemical element or the second layer does not substantially contain the first chemical element such a circumstance refers to the primary composition of the first or second layer excluding contaminants, trace elements, and diffused material from surrounding structures. Understandably, contaminants, trace elements, and diffused materials can potentially insignificantly alter the composition of the first or second layers in a manufacturing process without causing such layers to substantially contain the first or second chemical elements.

Accordingly, a still further aspect of the invention provides an electronic device interface forming method that includes forming a first layer containing a first chemical element, chemisorbing a first portion of at least one monolayer over the first layer, and chemisorbing a second portion of the at least one monolayer over the first layer. The first portion of the at least one monolayer can contain the first chemical element. The second portion of the at least one monolayer can contain a second chemical element different from the first chemical element. The first and second portions of the at least one monolayer can form part of an interface layer. The method can further include forming a second layer containing a second chemical element on the interface layer. Preferably, the first portion of the at least one monolayer can be chemisorbed on first parts of the first layer and the second portion of the at least one monolayer can be chemisorbed on second parts of the first layer.

In a still further aspect of the invention, an electronic device interface forming method includes forming a first device layer containing a first chemical element, chemisorbing a first unsaturated interface layer containing the first chemical element on the first device layer, and chemisorbing a second unsaturated interface layer at least on the first device layer in areas not saturated by the first interface layer. The first interface layer can have a thickness of from about 1 to about 10 monolayers. The second interface layer can have a thickness of from about 1 to about 10 monolayers and contain a second chemical element different from the first chemical element. The method can further include forming a second device layer containing the second chemical element on the first and second interface layers. One example of a first device layer can be a capacitor plate while a second device layer can be a capacitor dielectric. Similarly, the first device layer can be a capacitor dielectric while the second device layer is a capacitor plate.

Figure 4:
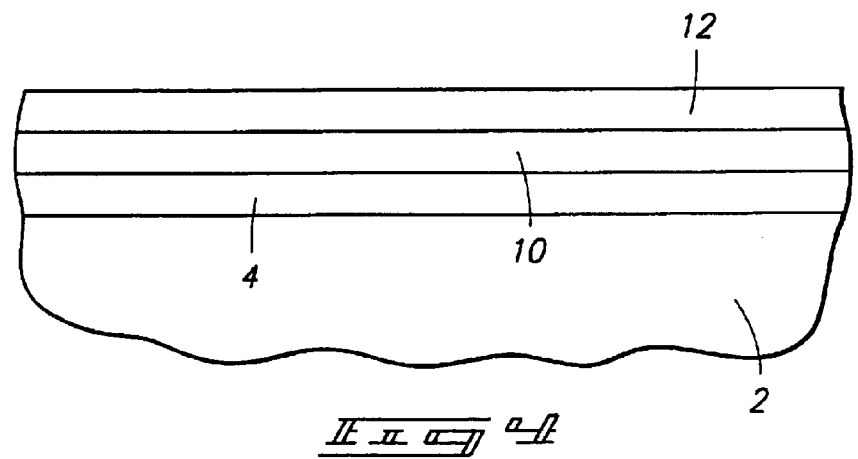
FIG. 4 shows a sectional view of a substrate portion at a processing step subsequent to that shown in FIG. 3.

Turning to FIG. 1, a substrate 2 is shown with a first layer 4 formed thereon. In FIG. 2, a first material 6 is formed on parts of first layer 4 but not on other parts of first layer 4, namely unsaturated areas 14. The first material 6 is shown in FIG. 2 as a graphical representation of individual molecules or atoms chemisorbed to the surface of first layer 4. In FIG. 3, a second material 8 is shown in graphical representation chemisorbed in formerly unsaturated areas 14 on first layer 4. The monolayer of first material 6 and monolayer of second material 8 formed in unsaturated areas 14 thus form an interface layer 10. Interface layer 10 can have a thickness of from about 1 to about 10 monolayers, or a greater thickness depending on a particular application. FIG. 4 shows a second layer 12 formed on interface layer 10 with interface layer 10 shown as a material layer, rather than a graphical representation of chemisorbed molecules or atoms.

Although the preferred method described above in relation to FIGS. 1–4 includes separate formation of first material 6 and second material 8 on first layer 4, the layers of first and second materials 6, 8 could conceivably be formed simultaneously. Thus, the structure of FIG. 3 can be obtained by forming both first and second materials 6, 8 on first layer 4 of FIG. 1 simultaneously rather than as shown in FIG. 2.

An advantage of using ALD to form first and second materials 6, 8 is that desired properties of interface layer 10 can be controlled at the atomic level. Interfacial properties such as dead layers, surface defects, vacancies, and impurities, as known to those skilled in the art can be improved with selection of suitable components for the interface layer and ALD processing conditions. For example, saturation of the surface of first layer 4 with intermixed first and second materials 6, 8 can reduce vacancies at the interface between first layer 4 and second layer 12. Further, selection of elements exhibiting suitable atomic diameters for interface layer 10 can improve the packing density of the interface between first layer 4 and second layer 12. The reduction in defects at the interface can provide a better functioning device. It is an additional advantage that an interface layer formed according to the various aspects of the invention described above can improve adhesion between first layer 4 and second layer 12. Existing knowledge of those skilled in the art regarding adhesion between particular materials can be used to select a compositional ratio of first material 6 to second material 8 in interface layer 10. Similarly, such information can be used to select potentially different compositional ratios for each monolayer formed as part of an interface layer. For example, interface layer 10 can have a fixed composition among monolayers. A ratio of first material 6 to second material 8 may be selected and then processing structured to produce the fixed composition. For an interface layer between $Ta_2O_5$ and Pt, about 5 monolayers of Pt can be chemisorbed on the $Ta_2O_5$ followed by about 5 monolayers of $Ta_2O_5$. Additional alternating Pt and $Ta_2O_5$ material can be added in about equal numbers of monolayers to a desired interface layer depth. The resulting interface layer can exhibit about a 1:1 ratio of Pt to $Ta_2O_5$.

As another example, interface layer 10 can have a composition gradient among monolayers. A beginning ratio of first material 6 to second material 8 may be initially selected and then altered as successive monolayers are added to form interface layer 10. A ratio proximate an inner surface of interface layer 10 can thus be different from a ratio proximate an outer surface of interface layer 10. For an interface layer between $Ta_2O_5$ and Pt, about 5 monolayers of Pt can be chemisorbed on the $Ta_2O_5$ followed by about 5 monolayers of $Ta_2O_5$. Additional alternating Pt and $Ta_2O_5$ material can be added with one further monolayer of Pt included in each turn. Accordingly, 6 Pt monolayers could chemisorbed, then 7 Pt monolayers, 8 Pt monolayers, and so on, each time followed by chemisorption of 5 $Ta_2O_5$ monolayers or less. As an alternative, the number of $Ta_2O_5$ monolayers could be decreased while holding the number of Pt monolayers constant. In either case, the ratio of Pt to $Ta_2O_5$ can increase as the interface layer depth increases to the point where a Pt layer is formed on the interface layer.

Formation of Pt monolayers by ALD can be performed using a precursor pair of a cyclopentadienyl-platinum (Cp-Pt) complex and an oxidizer such as $H_2O$, $O_3$, $O_2$, $N_2O$, NO, isopropyl alcohol (IPA), mixtures thereof, and other oxidizers known to those skilled in the art or later recognized. At a temperature of about 175 to about 275° C. and a pressure of about 10 milliTorr to about 10 Torr, Cp-Pt may be pulsed over a substrate for about 0.3 to about 3 seconds. After purging for about 0.5 to about 10 seconds, the oxidizer may be pulsed for a time similar to Cp-Pt, followed by another purge to complete one cycle and to form one monolayer having a typical depth of about 1 Angstrom. Completion of five cycles can thus form 5 monolayers.

Formation of Pt monolayers by ALD can be performed in a similar manner alternatively using Cp-Pt, platinum-hexafluoroacetylacetonate (Pt-HFA), platinum-acetylacetonate, platinum-tetrakis(trifluorophosphine) (Pt$(PF_3)_4$), cyclopentadienyl-platinum-trimethyl ($CpPtMe_3$), methylcyclopentadienyl-platinum-trimethyl ((MeCp)$PtMe_3$), or mixtures thereof.

Formation of $Ta_2O_5$ monolayers by ALD can be performed using a precursor pair of tantalum tetraethoxide dimethylaminoethoxide (TATDMAE) and an oxidizer such as $H_2O$, $O_3$, $O_2$, $N_2O$, NO, isopropyl alcohol (IPA), mixtures thereof, and other oxidizers known to those skilled in the art or later recognized. At a temperature of about 200 to about 500° C. and a pressure of about 10 milliTorr to about 10 Torr, TATDMAE may be pulsed over a substrate for about 0.3 to about 3 seconds. After purging for about 0.5 to about 10 seconds, the oxidizer may be pulsed for a time similar to TATDMAE, followed by another purge to complete one cycle and to form one monolayer having a typical depth of about 1 Angstrom. Completion of five cycles can thus form 5 monolayers.

Formation of $Ta_2O_5$ monolayers by ALD can be performed in a similar manner alternatively using TATDMAE, $TaCl_5$, $TaF_5$, tantalum pentaethoxide (TAETO), or mixtures thereof.

The present aspects of the invention include apparatuses as well as the methods described above. In one aspect, an apparatus can include a first layer containing a first chemical element, an interface layer chemisorbed on the first layer, and a second layer on the interface layer. The interface layer can contain at least one monolayer of the first chemical element intermixed with a second chemical element different from the first chemical element. The second layer can contain the second chemical element. Examples of material types and compositions for the first layer, interface layer, and second layer are described above.

In another aspect, an electronic device can include a first layer containing a first chemical element, a second layer containing a second chemical element different from the first chemical element, and an interface layer between and in contact with the first and second layers. The interface layer can contain first and second chemical elements and not substantially contain material originating from the first or second layers. Preferably, the interface layer contains at least one monolayer of intermixed first and second chemical elements chemisorbed on the first layer. An interface layer still does not substantially comprise material originating from the first or second layers when contaminants or trace elements of the first or second layers diffuse into the interface layer.

In a further aspect of the invention, an electronic device includes a first layer containing a first chemical element, a first portion of at least one monolayer chemisorbed on the first layer, a second portion of the at least one monolayer chemisorbed on the first layer, an interface layer comprising the first and second portions of the at least one monolayer, and a second layer on the interface layer. The first portion can contain the first chemical element and the second portion can contain a second chemical element different from the first chemical element. The second layer can also contain the second chemical element. Preferably, the first portion of the at least one monolayer is chemisorbed on first parts of the first layer and the second portion of the at least one monolayer is chemisorbed on second parts of the first layer. The at least one monolayer can include from about 1 to about 10 monolayers.

The apparatuses and electronic devices described above can exhibit similar advantages to those indicated in relation to the interface forming methods of the present invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An interface forming method comprising:
   forming a first capacitor plate with a conductive first layer comprising a first metal;
   chemisorbing on and in contact with the first layer an interface layer comprising at least two monolayers that each have the first metal intermixed with a second metal different from the first metal; and
   forming a capacitor dielectric with an insulative second layer comprising the second metal on and in contact with the interface layer and improving adhesion between the first layer and the second layer compared to adhesion otherwise occurring with the second layer formed on and in contact with the first layer in the absence of the interface layer.

2. The method of claim 1 wherein the first layer does not substantially comprise the second metal.

3. The method of claim 2 wherein the second layer does not substantially comprise the first metal.

4. The method of claim 1 wherein the second layer does not substantially comprise the first metal.

5. The method of claim 1 further comprising forming a second capacitor plate over the dielectric layer.

6. The method of claim 1 wherein the first layer comprises a first metal other than Ta and the second layer comprises $Ta_2O_6$.

7. The method of claim 6 wherein the first metal comprises Pt.

8. An electronic device interface forming method comprising:
   forming an electronic device interface layer between and in contact with a capacitor plate having a first layer comprising a first metal and a capacitor dielectric having a second layer comprising a second metal different from the first metal; and
   the interface layer being formed separately from forming the first and second layers, comprising the first and second metals, not substantially comprising material from the first or second layers as separately formed, and improving adhesion between the first layer and the second layer compared to adhesion otherwise occurring with the second layer formed on and in contact with the first layer in the absence of the interface layer.

9. The method of claim 8 wherein the first layer does not substantially comprise the second metal.

10. The method of claim 9 wherein the second layer does not substantially comprise the first metal.

11. The method of claim 8 wherein the second layer does not substantially comprise the first metal.

12. The method of claim 8 wherein the interface layer comprises at least one monolayer of intermixed first and second metals chemisorbed on the first layer.

13. A capacitor interface forming method comprising:
forming a capacitor plate comprising a first metal;
chemisorbing a first portion of at least one monolayer on and in contact with the capacitor plate, the first portion comprising the first metal;
chemisorbing a second portion of the at least one monolayer over the capacitor plate, the second portion comprising a second metal different from the first metal and the first and second portions of the at least one monolayer being comprised by an interface layer; and
forming a dielectric layer comprising the second metal on and in contact with the interface layer and improving adhesion between the capacitor plate and the dielectric layer compared to adhesion otherwise occurring with the dielectric layer formed on and in contact with the capacitor plate in the absence of the interface layer.

14. The method of claim 13 wherein the capacitor plate does not substantially comprise the second metal.

15. The method of claim 14 wherein the dielectric layer does not substantially comprise the first metal.

16. The method of claim 13 wherein the dielectric layer does not substantially comprise the first metal.

17. The method of claim 13 wherein the first portion of the at least one monolayer is chemisorbed on first parts of the capacitor plate and the second portion of the at least one monolayer is chemisorbed on second parts of the capacitor plate.

18. A capacitor interface forming method comprising:
forming capacitor plate comprising a first metal;
chemisorbing a first unsaturated interface layer comprising the first metal on and in contact with the capacitor plate, the first interface layer having a thickness of from about 1 to about 10 monolayers;
chemisorbing a second unsaturated interface layer at least on the capacitor plate in areas not saturated by the first interface layer, the second interface layer comprising a second metal different from the first metal and having a thickness of from about 1 to about 10 monolayers; and
forming a dielectric layer comprising the second metal on the first and second intermixed interface layers.

19. The method of claim 18 wherein the capacitor plate does not substantially comprise the second metal.

20. The method of claim 19 wherein the dielectric layer does not substantially comprise the first metal.

21. The method of claim 18 wherein the dielectric layer does not substantially comprise the first metal.

22. The method of claim 1 wherein the interface layer comprises at least two monolayers and the chemisorbing comprises providing a composition gradient across a thickness of the interface layer by increasing a composition ratio of the second metal to the first metal as the thickness of the interface layer increases.

23. The method of claim 1 wherein the chemisorbing comprises atomic layer depositing.

24. The method of claim 1 wherein the first metal is selected from the group consisting of Pt and Ru.

25. The method of claim 1 wherein the second metal is selected from the group consisting of Ba, Sr, Ti, Pb, Zr, and Ta.

26. The method of claim 1 wherein the first layer consists of Pt or Ru.

27. The method of claim 1 wherein the second layer consists of barium strontium titanate, lead zirconate titanate, or $Ta_2O_5$.

28. An electronic device interface forming method comprising:
forming a conductive first electronic device layer comprising a first chemical element selected from the group consisting of Pt and Ru;
chemisorbing on and in contact with the first layer an interface layer comprising at least two monolayers, the interface layer comprising the first chemical element intermixed with a second chemical element different from the first chemical element to provide a composition gradient across a thickness of the interface layer; and
forming an insulative second electronic device layer comprising the second chemical element on and in contact with the interface layer.

29. The method of claim 28 wherein the chemisorbing comprises increasing a composition ratio of the second chemical element to the first chemical element as the thickness of the interface layer increases.

30. The method of claim 28 wherein an innermost portion of the interface layer proximate the first layer exhibits a first composition ratio of the first to the second chemical element and an outermost portion of the interface layer proximate the second layer exhibits a second composition ratio of the first to the second chemical element, the first ratio being greater than the second ratio.

31. The method of claim 28 wherein the second chemical elements is a metal.

32. The method of claim 28 wherein the chemisorbing comprises atomic layer depositing.

33. The method of claim 28 wherein the second chemical element is Ta.

34. The method of claim 28 wherein the second chemical element is selected from the group consisting of Ba, Sr, Ti, Pb, Zr, and Ta.

35. The method of claim 28 wherein the first layer consists of Pt or Ru.

36. The method of claim 28 wherein the second layer consists of BST, PZT, or $Ta_2O_5$.

37. A capacitor plate-to-dielectric interface forming method comprising:
forming a first capacitor plate over a semiconductive substrate, the first plate comprising a first metal selected from the group consisting of Pt and Ru;
chemisorbing an interface layer on and in contact with the first plate, the interface layer comprising a plurality of monolayers including at least one intermixed monolayer having the first metal intermixed in such monolayer with a second metal selected from the group consisting of Ba, Sr, Ti, Pb, Zr, and Ta; and
forming a capacitor dielectric layer comprising the second metal on and in contact with the interface layer and improving adhesion between the first plate and the dielectric layer compared to adhesion otherwise occurring with the dielectric layer formed on and in contact with the first plate in the absence of the interface layer; and
forming a second capacitor plate over the dielectric layer.

38. The method of claim 37 wherein the first plate consists of Pt or Ru.

39. The method of claim 37 wherein the dielectric layer consists of barium strontium titanate, lead zirconate titanate, or $Ta_2O_5$.

40. The method of claim 37 wherein the chemisorbing comprises providing a composition gradient across a thickness of the interface layer by increasing a composition ratio of the second metal to the first metal as the thickness of the interface layer increases.

* * * * *

UNITED STATES PATENT AND TRADEMARK OFFICE
CERTIFICATE OF CORRECTION

PATENT NO.   : 6,908,639 B2
DATED        : June 21, 2005
INVENTOR(S)  : Cem Basceri et al.

It is certified that error appears in the above-identified patent and that said Letters Patent is hereby corrected as shown below:

Column 8,
Line 52, replace "$Ta_2O_6$" with -- $Ta_2O_5$ --.

Signed and Sealed this

Seventh Day of February, 2006

JON W. DUDAS
*Director of the United States Patent and Trademark Office*